(12) United States Patent
Teranuma et al.

(10) Patent No.: US 6,667,481 B2
(45) Date of Patent: Dec. 23, 2003

(54) TWO-DIMENSIONAL IMAGE SENSOR

(75) Inventors: Osamu Teranuma, Tenri (JP); Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 305 days.

(21) Appl. No.: 09/794,023

(22) Filed: Feb. 28, 2001

(65) Prior Publication Data

US 2001/0020683 A1 Sep. 13, 2001

(30) Foreign Application Priority Data

Mar. 9, 2000 (JP) ........................................ 2000-065442

(51) Int. Cl.[7] .......................... H01L 25/00; H01L 27/00
(52) U.S. Cl. ................................ 250/370.09; 250/370.01
(58) Field of Search ........................ 250/370.09, 370.01; 378/98.2; 257/11, 53, 54, 55, 56, 225, 414, 428, 429, 430

(56) References Cited

U.S. PATENT DOCUMENTS

| | | | | |
|---|---|---|---|---|
| 6,326,625 B1 | * | 12/2001 | Zur ........................ | 250/370.09 |
| 6,373,116 B1 | * | 4/2002 | Teranuma et al. ..... | 375/240.21 |
| 2002/0158208 A1 | * | 10/2002 | Mori et al. ............ | 250/370.11 |

FOREIGN PATENT DOCUMENTS

| | | |
|---|---|---|
| JP | 6-342098 A | 12/1994 |
| JP | 10-170658 A | 6/1998 |
| JP | 11-68078 A | 3/1999 |
| WO | 96/34416 | 10/1996 |

OTHER PUBLICATIONS

Lee et al, "A New Digital Detector for Projection Radiography", SPIE, vol. 2432, 7–1995, pp. 237–249.
Jeromin et al, "8.4: Application of a Si Active–Matrix Technology in a X–Ray Detector Panel", SID 97 Digest, 1997, pp. 91–94.
Polischuk et al,"Direct Conversion Detector for Digital Mammography", SPIE, vol. 3659, Feb. 1999, pp. 417–425.

* cited by examiner

Primary Examiner—David Porta
Assistant Examiner—Christine Sung
(74) Attorney, Agent, or Firm—Nixon & Vanderhye, PC

(57) ABSTRACT

The present two-dimensional image sensor is constituted by: a photoconductive film for converting electromagnetic radiation carrying image information to electric charge; an active matrix substrate including: a pixel accommodating layer for accommodating pixel electrodes connected to the photoconductive film to accumulate the electric charge in the photoconductive film; a wiring layer, located opposite the pixel electrodes across the pixel accommodating layer, for providing gate lines, source lines, etc. to detect the accumulated electric charge; and first and second insulating protection layers interposed between the pixel accommodating layer and the wiring layer; and a common electrode, located opposite the pixel accommodating layer across the photoconductive film, for developing an electric field between itself and the pixel electrodes, wherein: the common electrode is provided in a pixel region in which the pixel electrodes are disposed. The arrangement can better ensure that no insulation breakdown occurs outside the pixel region due to application of a high voltage caused by, for instance, excessive projection of X-rays.

14 Claims, 5 Drawing Sheets

TWO-DIMENSIONAL IMAGE SENSOR

FIELD OF THE INVENTION

The present invention relates two-dimensional image sensors for detecting electromagnetic radiation (X-rays, visible light, infrared light, etc.) images.

BACKGROUND OF THE INVENTION

A conventional two-dimensional image sensor for electromagnetic radiation images is provided with semiconductor sensors arranged in a two-dimensional matrix form. Each semiconductor sensor is equipped with an electric switch and, as it detects X-rays, visible light, and other kinds of radiation (hereinafter, the description will focus on X-rays which represent all kinds of radiation), produces electric charge (electron-hole). The electric switches are activated one row at a time to measure the electric charge produced by the semiconductor sensor in each column.

Two-dimensional image sensors of this kind are described in terms of specific structure and detecting principles in, for example, D. L. Lee, et al., *A New Digital Detector for Projection Radiography*, SPIE, 2432, pp.237–249,1995 (published in May 1995); L. S. Jeromin, et al., *Application of a-Si Active-Matrix Technology in a X-Ray Detector Panel*, SID '97 DIGEST, page 91–94, 1997 (published in May 1997); Japanese Laid-Open Patent Application No. 6-342098/1994 (Tokukaihei 6-342098; published on Dec. 13, 1994); and other documents.

The following will discuss the arrangement and detecting principles of a conventional two-dimensional image sensor in reference to FIG. 4 and FIG. 5. FIG. 4 is a plan view and a cross-sectional view taken along line A—A of the plan view, both showing a conventional two-dimensional image sensor. FIG. 5 is a cross-sectional view showing a single pixel in the two-dimensional image sensor of FIG. 4. The cross-sectional view of FIG. 4 does not partly show the structure in detail so much as FIG. 5.

The two-dimensional image sensor of FIG. 4 and FIG. 5 has a basic structure in which a photoconductive film 102 and a common electrode (upper common electrode) 103 are formed in this order on the active matrix substrate 101.

The active matrix substrate 101 includes: a glass substrate 104; TFTs (Thin Film Transistors) 105 as switching elements and charge storage capacitances (Cs capacitances) 106 provided on the glass substrate 104; and pixel electrodes 107 provided so as to cover all these members. Pixels, each of which is constituted by the TFT 105, the charge storage capacitance 106, and the pixel electrode 107, are arranged in an X-Y matrix form (two-dimensional matrix form).

The TFT 105 is constituted by a gate electrode 108, a gate insulating film 109, an a-Si (amorphous silicon) layer (i-layer) 110, an a-Si layer ($n^+$ layer) 111, a source electrode 112, and a drain electrode 113. The charge storage capacitance 106 is constituted by a storage capacitance electrode (Cs electrode) 114, a gate insulating film 109, a storage capacitance electrode 113 (which also acts as the drain electrode 113).

The pixel electrode 107 is electrically insulated from the TFT 105 and the charge storage capacitance 106, as well as electrode wires connected to these members, by an intervening insulating layer (insulating protection layer) 115 and an insulating layer (insulating protection layer) 116. The pixel electrode 107 and the drain electrode 113 are electrically coupled via a contact hole formed through the insulating layers 115 and 116.

The photoconductive film 102 is provided so as to cover the pixel electrodes 107 and the insulating layer 116 in the active matrix substrate 101. The common electrode 103 is provided so as to cover the photoconductive film 102.

The photoconductive film 102, when irradiated with X-rays, produces electric charge (electron-hole) in it. The photoconductive film 102 is made from a semiconductor material, such as a-Se, that is selected depending on the wavelength of the electromagnetic radiation to be detected.

The common electrode 103 and the storage capacitance electrode 114 are arranged so that an electric voltage can be applied across them.

In the active matrix substrate 101, under the insulating layers 115 and 116 is formed a wiring layer 120 which includes, among others, the gate (scan), source (signal), and Cs (capacitance) lines coupled respectively to the gate electrodes 108, the source electrodes 112, and storage capacitance electrodes 114 for the individual pixels. The cross-sectional view of FIG. 4 shows a gate line as the wiring layer 120.

The wires extend to edges of the glass substrate 104 which are outside a pixel region 118 (region in which the pixel electrodes 107 are disposed). The wires are connected to a scan control circuit, a signal processing circuit, or another external circuit (not shown) at the edges of the glass substrate 104 via a TCP (Tape Carrier Package).

Now, operating principles of the two-dimensional image sensor will be explained. The photoconductive film 102 internally produces electric charge (electron-hole) when the photoconductive film 102 is irradiated with X-rays while voltage is being applied to the common electrode 103 and the storage capacitance electrode 114. The produced electric charge moves toward either the positive or negative electrode depending on the polarity of the applied voltage and stored in the charge storage capacitance 106.

The electric charge stored in the charge storage capacitance 106 is dischargeable through the source electrode 112 when the TFT 105 conducts in response to an input signal to the gate electrode 108.

The pixels, since being arranged in an X-Y matrix form as described above, is capable of producing two-dimensional information of the image, by sequentially feeding the gate electrodes 108 with a signal and detecting the electric charge discharged through the source electrodes 112 for each source line.

Incidentally, the efficiency of photoelectric conversion by the photoconductive film 102 varies depending on the material composing the photoconductive film 102. Typically, to achieve a desirable or even better efficiency, the photoconductive film 102 needs to be thick. For example, an a-Se photoconductive film 102 is deposited at a thickness of about 0.5 mm to 1.5 mm. In this case, the applied voltage should be as high as a few kilovolts.

Under these circumstances, if X-rays are shone excessively or the TFT 105 is turned off for an extended period of time, as electric charge builds up in the detecting of the image, a high voltage, which is almost equal to the applied voltage at maximum, is applied across the pixel electrode 107. Therefore, the applied voltage of a few kilovolts may place a voltage load as high as a few kilovolts at maximum to the pixel electrodes 107.

When this voltage load becomes greater than the tolerable voltage of the TFT 105 or the charge storage capacitance 106, the TFT 105 or the charge storage capacitance 106 are destructed due to insulation breakdown, seriously affecting the operation of the image sensor.

Related to this problem, some measures have been devised to prevent the destruction of the TFT 105 and the charge storage capacitance 106. Specifically, Japanese Laid-Open Patent Application No. 6-342098/1994 and other documents disclose protector capacitance; Japanese Laid-Open Patent Application No. 10-170658/1998 (Tokukaihei 10-170658; published on Jun. 26, 1998) and other documents disclose discharge of excessively stored electric charge by a protection circuit separately provided in the pixel; Brad Polischuk, et al., *Direct Conversion Detector for Digital Mammography*, SPIE Physics of Medical Imaging, 1999, Vol. 3659, pages 417–425 (published on May 1999) and other documents disclose discharge of excessively stored electric charge by means of voltage breakdown properties of the TFT element; and PCT WO96/34416 (published on Oct. 31, 1996) and other documents disclose discharge of excessively stored electric charge by means of a double gate structure TFT.

These measures, except those involving the formation of a protector capacitance, basically have limited effects only in the pixel region 118. The formation of the protector capacitance, depending on where it is formed, produces expanded effects beyond the pixel region 118, but is unsuitable to taking motion pictures because the resetting of the stored electric charge takes some time.

Now, we will consider problems related to the voltage load in a peripheral region R which is an area surrounding the pixel region 118.

An image can be detected by means of projection of X-rays in an image detecting region which is defined as the area in which the pixel region 118, the region in which the photoconductive film 102 is provided, and the region in which the common electrode 103 is provided are stacked in a normal direction to the surface of the glass substrate 104.

Therefore, if the image detecting region is to be provided utilizing the pixel region 118 as much as possible, the pixel region 118 needs to be covered entirely with the photoconductive film 102 and the common electrode 103. Typically, positioning accuracy is taken into consideration in design of the image detecting region as shown in FIG. 4, and the photoconductive film 102 and the common electrode 103 are provided extending beyond the borders of the pixel region 118.

Besides, in the peripheral region R surrounding the pixel region 118 on the active matrix substrate 101, the wiring layer 120 in which scan lines, signal lines, and capacitance lines are provided is located under the insulating layers 115 and 116.

Therefore, in the peripheral region R, in the region where the wiring layer 120, the photoconductive film 102, and the common electrode 103 are stacked, a high voltage may possibly be applied to the insulating layers 115 and 116 on the wiring layer 120 due to electric charge produced in the photoconductive film 102 as a result of projection of excessive X-rays. This renders it possible for the insulating layers 115 and 116 to suffer insulation breakdown similarly to the pixel region 118.

Thus, the charge storage capacitance 106 and the TFT 105, as well as the scan control circuit and the signal processing circuit, may be possibly destructed, for they are all connected to the wires in the wiring layer 120.

Even with no excessive X-ray projection, if a high DC voltage is applied for an extended period of time to the common electrode 103 provided over the wiring layer 120 in the peripheral region R, the electric charge produced in the photoconductive film 102 is gradually attracted toward the insulating layers 115 and 116. Thus, electric charge is stored on the insulating layers 115 and 116, seriously affecting signals in the scan lines, the signal lines, and the capacitance lines in some instances.

SUMMARY OF THE INVENTION

In view of these problems, the present invention has an object to prevent a high voltage application resulting from excessive projection of X-rays outside a pixel region from causing an insulation breakdown of a two-dimensional image sensor incorporating a photoconductive semiconductor and other layers provided on an active matrix substrate. Hence, a physically highly reliable, two-dimensional image sensor can be presented which can detect both still images and motion pictures.

In order to accomplish the above object, a two-dimensional image sensor in accordance with the present invention includes:

a conversion layer for converting electromagnetic radiation carrying image information to electric charge;

a pixel substrate including: a pixel accommodating layer for accommodating pixel electrodes connected to the conversion layer to accumulate the electric charge in the conversion layer; a wiring layer, located opposite the conversion layer across the pixel accommodating layer, for providing electrode wires to detect the accumulated electric charge; and an insulating layer interposed between the pixel accommodating layer and the wiring layer; and an upper electrode, located opposite the pixel accommodating layer across the conversion layer, for developing an electric field between itself and the pixel electrodes, wherein:

the upper electrode is provided in a pixel region in which the pixel electrodes are disposed.

According to the arrangement, the pixel substrate is constituted by a wiring layer for providing electrode wires for detecting electric charge transmitted from pixel electrodes, an insulating layer, and a pixel accommodating layer for accommodating the pixel electrodes, the layers being stacked in this order. On the pixel accommodating layer of the pixel substrate are there provided a conversion layer for converting electromagnetic radiation to electric charge and an upper electrode for developing an electric field between itself and the pixel electrodes in this order to form a two-dimensional image sensor. Also, according to the arrangement, the upper electrode is provided in a pixel region in which the pixel electrodes are disposed.

According to the arrangement, the upper electrode is provided in the pixel region; therefore, no upper electrode is provided above the conversion layer outside the pixel region. Consequently, little voltage is applied to the portion of the conversion layer outside the pixel region. As a result, even when an electric field develops between the upper electrode and the pixel electrodes, an electric field hardly develops in the direction from the upper electrode to the electrode wires provided under the insulating layer.

This can restrain the electric charge produced in the conversion layer from being stored on the insulating layer above the electrode wires due to effects of the electric field. Therefore, the electric charge can be prevented from excessively stored on the insulating layer, and thus the insulating layer can be protected from insulation breakdown.

Further, since the electric charge is restrained from being stored on the insulating layer above the electrode wires, it becomes possible to restrain increases in the potential of the electrode wires due to the stored electric charge. This can restrain variations in the potential of the electrode wires and thereby retrain noise in signals transmitted through the electrode wires.

For a fuller understanding of the nature and advantages of the invention, reference should be made to the ensuing detailed description taken in conjunction with the accompanying drawings.

DESCRIPTION OF THE EMBODIMENTS

The following will discuss an embodiment in accordance with the present invention in reference to FIG. 1(a) to FIG. 3(b). In the present embodiment, a two-dimensional X-ray image sensor will be explained as an example of the two-dimensional image sensor.

Figure 1A:
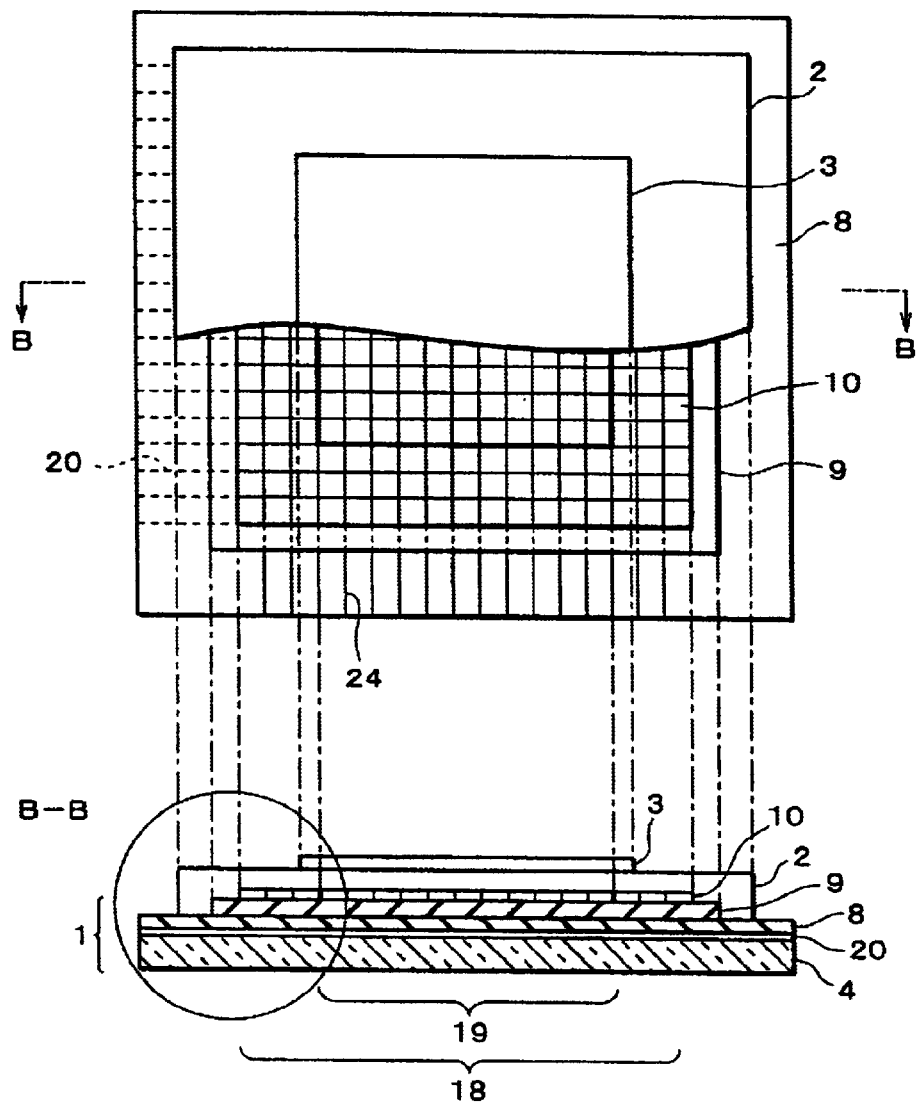
FIG. 1(a) and FIG. 1(b) show a basic arrangement of a two-dimensional image sensor of an embodiment in accordance with the present invention, FIG. 1(a) being a plan view and a cross-sectional view taken at line B—B of the plan view, FIG. 1(b) being an enlarged view of the enclosed part of the cross-sectional view of FIG. 1(a).
Figure 1B:
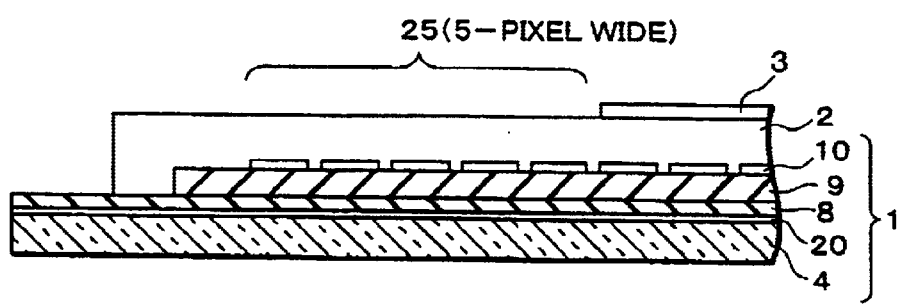
Figure 2:
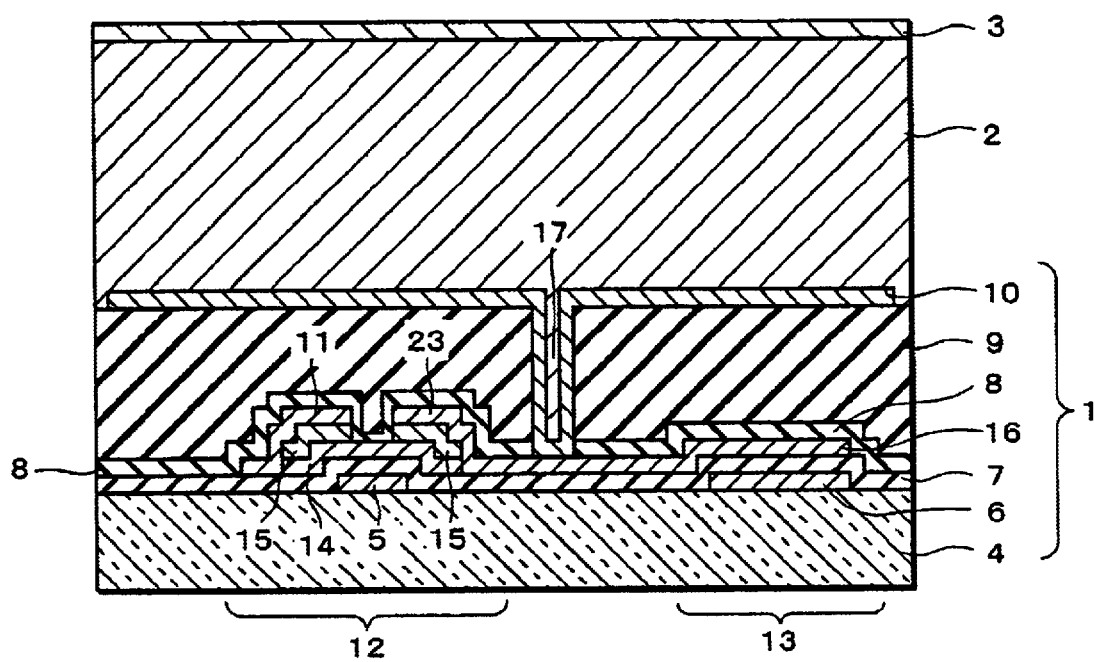
FIG. 2 is a cross-sectional view showing a single pixel in the two-dimensional image sensor of FIG. 1(a) and FIG. 1(b).

FIG. 1(a) and FIG. 1(b) show a basic arrangement of a two-dimensional image sensor of the present embodiment, FIG. 1(a) being a plan view and a cross-sectional view taken at line B—B of the plan view, FIG. 1(b) being an enlarged view of the enclosed part of the cross-sectional view of FIG. 1(a). FIG. 2 is a cross-sectional view showing a single pixel in the two-dimensional image sensor. Some members are shown only in FIG. 2 and omitted in the cross-sectional view of FIG. 1(a) and FIG. 1(b) for simplicity reasons (especially, in FIG. 1(a), pixels are shown in reduced numbers). Note that throughout the following description, a "region" refers to a specified area of the two-dimensional image sensor as it is viewed along the normal to its surface from above, that is, as shown in FIG. 1(a).

As shown in FIG. 1(a), FIG. 1(b), and FIG. 2, the two-dimensional image sensor of the present embodiment has a basic configuration, as a device, of a photoconductive film (photoconductive layer, semiconductor layer, conversion layer) 2 and a common electrode (upper electrode) 3 provided in this order on an active matrix substrate (pixel substrate) 1.

The active matrix substrate 1 is constituted by a glass substrate 4 acting as a support substrate and the members, detailed immediately below, provided on the glass substrate 4. On the glass substrate 4, are there provided gate electrodes 5, gate lines (scan lines, electrode wires) 20, storage capacitance electrodes (Cs electrodes) 6, and Cs lines (capacitance lines, electrode wires). The Cs lines, not shown to simplify the figure, are fabricated out of the same layer as the gate electrodes 5, the gate lines 20, and the storage capacitance electrodes 6 as continuous, extended parts of the storage capacitance electrodes 6.

A gate insulating film (insulating layer) 7, a first insulating protection layer (insulating layer) 8, and a second insulating protection layer (insulating layer) 9 are provided on a substantial entirety of the glass substrate 4, covering the electrodes and wires. Source lines (signal lines, electrode wires) 24 are provided between the gate insulating film 7 and the first insulating protection layer 8.

Note that throughout the following description, the Cs lines, the gate lines 20, and the source lines 24 will be collectively referred to as electrode wires. The electrode wires are for detecting electric charge accumulated by later-detailed pixel electrodes 10. The Cs lines are for applying a certain potential to the storage capacitance electrodes 6 so that the charge storage capacitances 13 can store electric charge. The gate lines 20 are for transmitting a signal to the gate electrodes 5 to exploit the switching operation of TFTs 12 to control the discharge of the stored electric charge to the source lines 24. The source lines 24 are for feeding the electric charge discharged through the TFTs 12 to an external sensor circuit and the like. The layer in which the electrode wires are provided will be referred to as a wiring layer.

On the second insulating protection layer 9 is there provided a pixel accommodating layer in which a plurality of pixel electrodes (lower electrodes) 10 are disposed. The pixel electrode 10 constitutes a pixel, whereas the region, as a whole, in which the pixels are disposed, constitutes a pixel region 18. The pixels are arranged on the active matrix substrate 1 in an X-Y matrix form (two-dimensional matrix form).

The TFTs (thin film transistors) 12 as switching elements and the charge storage capacitances (Cs capacitances) 13 are provided for associated pixels on the glass substrate 4 of the active matrix substrate 1. The pixel electrodes 10 are provided above the TFTs 12 and the charge storage capacitances 13 to cover them. The TFTs 12, the charge storage capacitances 13, the pixel electrodes 10, etc. are provided on the associated pixels.

The TFT 12 is constituted by a gate electrode 5, the gate insulating film 7, an a-Si layer (i layer) 14, an a-Si layer ($n^+$ layer) 15, a source electrode 11, and a drain electrode 23. The charge storage capacitance 13 is constituted by the storage capacitance electrode 6, the gate insulating film 7, and a storage capacitance electrode 16. The storage capacitance electrode 16 is fabricated out of the same layer as the drain electrode 23 as a continuous, extended part of the drain electrode 23.

The pixel electrode 10 is electrically insulated from the TFT 12 and the charge storage capacitance 13, as well as the wires connected to these members, by the intervening first and second insulating protection layers 8 and 9. The pixel electrode 10 and the drain electrode 23 are electrically connected to each other in the contact hole 17 provided through the first and second insulating protection layers 8 and 9.

The gate line 20, the source line 24, and the Cs line are connected to the gate electrode 5, the source electrode 11, and the storage capacitance electrode 6 of the pixel respectively. The cross-sectional view of FIG. 1(a) and FIG. 1(b) show the gate line 20.

The wires extend to the edges of the glass substrate 4 which are outside the pixel region 18 and are connected via TABs (Tape Automated Bonding) and the like to external devices (not shown), such as a scan control circuit and a signal processing circuit, at the edges of the glass substrate 4.

A photoconductive film 2 is provided to cover the pixel electrode 10 and the second insulating protection layer 9 in the active matrix substrate 1. A common electrode 3 is then provided to cover the photoconductive film 2.

The photoconductive film 2 internally produces electric charge (electron-hole) on exposure to X-rays; in other words, the photoconductive film 2 is for converting X-ray radiation carrying image information to electric charge. The photoconductive film 2 is made primarily of semiconductor material (e.g., a-Se) selected depending on the wavelengths of electromagnetic radiation to be detected.

Electrical contact is established between the photoconductive film 2 and the pixel electrode 10 so that the electric charge produced by the photoconductive film 2 is accumulated by the pixel electrode 10.

A high voltage power source is provided (not shown) to apply voltage to the common electrode 3 and the storage capacitance electrode 6. By the high voltage power source applying voltage to the common electrode 3 and the storage capacitance electrode 6, an electric field develops between the common electrode 3 and the pixel electrode 10 via the charge storage capacitance 13.

Now, operating principles of the two-dimensional image sensor will be explained. The photoconductive film 2 internally produces electric charge (electron-hole) when the photoconductive film 2 is irradiated with X-rays while voltage is being applied to the common electrode 3 and the storage capacitance electrode 6. The produced electric charge moves toward either the positive or negative electrode depending on the direction of the electric field developing from the applied voltage and stored in the charge storage capacitance 13.

The electric charge stored in the charge storage capacitance 13 is discharged through the source electrode 11 when the TFT 12 conducts in response to an input signal to the gate electrode 5.

The pixels, since being arranged in an X-Y matrix form as described above, are capable of producing two-dimensional information of the image, by sequentially feeding the gate electrodes 5 with a signal and detecting the electric charge discharged through the source electrodes 11 for each source line 24.

Now, a method of manufacturing the two-dimensional image sensor of the present embodiment and related topics will be explained in further detail.

First, the gate lines 20 and the source lines 24 arranged to form a lattice, the Cs lines, the TFTs 12 as the switching elements, the charge storage capacitance 13, among others, are provided on the glass substrate 4.

The glass substrate 4 may be, for instance, a non-alkaline glass substrate (available from Corning Inc. as #7059 and #1737, for example). Then, the gate electrodes 5 and the storage capacitance electrodes 6 are provided on the glass substrate 4. These are fabricated by vapor-depositing Ta (Tantalum), Al (Aluminum), or another metal on the glass substrate 4 by sputtering to form a film having a thickness of about 3000 Å and then etching the metal film in a desired pattern.

The gate insulating film 7 is fabricated at a thickness of about 3500 Å from SiNx (silicon nitrides), SiOx (silicon oxides), or other materials, by CVD on a substantial entirety of the glass substrate 4, covering the gate electrodes 5 and the storage capacitance electrodes 6. The gate insulating film 7 doubles as a dielectric for the charge storage capacitances 13. The gate insulating film 7 is not necessarily fabricated only from SiNx, SiOx, etc.; alternatively, for simultaneous use with this kind of gate insulating film 7, may an anodized film be formed by anodizing the gate electrodes 5 and the storage capacitance electrodes 6.

The i layer 14 is provided as a channel section of the TFT 12 over the gate electrode 5 with the gate insulating film 7 intervening therebetween, and the $n^+$ layer 15 is provided on the i layer 14 to act as a contact between the i layer 14 and the source and drain electrodes 11 and 23. These layers are fabricated by depositing a-Si by CVD to form films having thicknesses of about 1000 Å and 400 Å respectively and then etching the a-Si films into desired patterns.

On the $n^+$ layer 15 are the source electrodes 11 and the drain electrodes 23 fabricated out of the same layer as the storage capacitance electrodes 16. Specifically, these are fabricated, similarly to the foregoing gate electrodes 5 and the storage capacitance electrodes 6, by vapor-depositing Ta, Al, or another metal by sputtering to form a film having a thickness of about 3000 Å and then etching the metal film into a desired pattern.

The first insulating protection layer 8 is disposed to cover a substantial entirety of the glass substrate 4 on which the TFTs 12 and the charge storage capacitances 13 are fabricated in this manner. The first insulating protection layer 8 is fabricated by depositing SiNx by CVD to form a film having a thickness of about 3000 Å and then removing specified portions of the SiNx film where the contact holes 17 will be provided above the drain electrodes 23.

Then, the second insulating protection layer 9 is disposed to cover a substantial entirety of the top of the first insulating protection layer 8. The second insulating protection layer 9 is fabricated by forming a film of a photosensitive acrylic resin or another similar material at a thickness of about 3 $\mu$m and patterning the film by photolithography to form the contact holes 17 at those portions of the first insulating protection layer 8 which will be parts of the contact holes 17.

The pixel electrodes 10 are fabricated on the second insulating protection layer 9 by vapor-depositing ITO (Indium Tin Oxide) by sputtering to form a film having a thickness of about 2000 Å and then etching the ITO film in a desired pattern. Electrical contact is established between the pixel electrodes 10 and the drain electrodes 23 (short-circuited) in the contact holes 17 provided through the first and second insulating protection layers 8 and 9.

In the present embodiment, as mentioned above, the active matrix substrate 1 has a so-called roof structure (pixel on passivation) wherein the pixel electrodes 10 are positioned right above the TFTs 12; alternatively, the active matrix substrate 1 may have a non-roof structure. Further, the switching element is an inverted stagger structure TFT 12 using a-Si; alternatively, p-Si (polysilicon) may be used or the TFT 12 may have a stagger structure.

The a-Se photoconductive film 2 is provided on the pixel region 18 of the active matrix substrate 1 thus fabricated. The photoconductive film 2 is fabricated by vapor-deposition at a thickness of about 0.5 mm to 1.5 mm, so as to cover the entire pixel region 18.

The common electrode 3 is fabricated of Au (gold) at a thickness of about 2000 Å on the photoconductive film 2 so as to cover the pixel region 18 by vacuum evaporation.

Now, further referring to the two-dimensional image sensor of the present embodiment, the structure around the pixel region 18 will be explained. As defined earlier, the pixel region 18 refers to the whole area in which pixels are disposed. An image detecting region 19 is defined as a region in which effective pixels exist which are located in the pixel region 18 and actually work for image detection. The image detecting region 19 is enclosed by a thick line in the plan view of FIG. 1(*a*).

The photoconductive film 2 is provided larger than the pixel region 18 of the active matrix substrate 1 to completely cover the pixel region 18 for the reason mentioned earlier: that is, accuracy is taken into consideration in the positioning of the photoconductive film 2 and the pixel region 18 of the active matrix substrate 1. Also, the arrangement prevents the pixel region 18 from being exposed and gives protection to the pixel region 18 by the photoconductive film 2.

The common electrode 3 is provided in the pixel region 18. The image detecting region 19 is in turn specified in a region where the common electrode 3 is provided (hereinafter, will be referred to as a common electrode region).

By specifying the image detecting region 19 in the common electrode region, those pixel electrodes 10 outside the image detecting region 19 become available for a special purpose of preventing insulation breakdown (detailed later) and thereby can prevent deterioration of the quality of detected images. Also, the size of the pixel region 18 becomes adjustable based on the specified size of the image detecting region 19.

Here, the pixel electrode 10 is specified to be a square 130 µm long on each side, and the pixel pitch is set to 150 µm. The pixel region 18 is specified to be a square about 432.1 mm long on each side, the common electrode 3 a square about 430.6 mm long on each side, and the image detecting region 19 a square about 430 mm long on each side.

More specifically, the common electrode 3 and the pixel region 18 are stacked on the glass substrate 4 in a normal direction to the surface of the glass substrate 4, so that five lines of pixels are positioned external to each side of the common electrode 3, or in other words, five pixels are lined vertical and external to each side of the common electrode 3. Therefore, the common electrode 3 is disposed in the pixel region 18 with each side of the former being separated by a distance equivalent to five pixels from the associated side of the latter.

By thus arranging the peripheral area of the common electrode 3, the present two-dimensional image sensor comes to have the following advantages. Note that throughout the description below, "to overlap" refers to a state where an object is stacked on, over, or below another object when viewed along the normal to the surface of the glass substrate 4.

Reference is made in the following description to a portion of the pixel region 18 (including the image detecting region 19) overlapping the common electrode 3. In this portion, the photoconductive film 2 internally produces electric charge according to the amount of projected X-rays. The electric charge is transmitted by the pixel electrodes 10 and stored in the charge storage capacitances 13. The stored electric charge is discharged when the image data is read out for each frame. In those pixels located outside the image detecting region 19, i.e., non-effective pixels which do not work for image detection, the image data is read out simply to let the charge storage capacitances 13 discharge.

Therefore, in normal image detecting operation, it is unlikely that an excessive amount of electric charge is stored in this portion and causes a high voltage to be applied to the charge storage capacitance 13. Therefore, in this event, chances are slim for the charge storage capacitance 13 to cause an insulation breakdown.

Also, to solve the problem of a high voltage applied to the charge storage capacitance 13 caused by excessive irradiation by X-rays and resultant storage of an excessive amount of electric charge in the pixel region 18, a mechanism merely needs to be provided to discharge excessively stored electric charge. The mechanism to discharge excessively stored electric charge may be chosen from, for example, those utilizing a protection circuit, voltage breakdown properties of the TFTs 12, and double gate structured TFTs, whichever is appropriate. The incorporation of such a mechanism can prevent an insulation breakdown of the charge storage capacitances 13.

Now, reference is made in the following description to a portion of the pixel region 18 not overlapping the common electrode 3. In this portion, little voltage is applied from the common electrode 3 for structural reasons; therefore, the electric charge produced internally by the photoconductive film 2 irradiated by X-ray projection is unlikely to be transmitted by the pixel electrodes 10 and stored in the charge storage capacitances 13. However, an electric field may possibly develop in a part of the photoconductive film 2 which does not overlap the common electrode 3 due to the electric field developing diagonally at the edges of the common electrode 3.

The present two-dimensional image sensor addresses this problem by, as mentioned earlier, specifying a region which is constituted by those five lines of pixels positioned external to each side of the common electrode 3 and which do not overlap the common electrode 3 (hereinafter, will be referred to as a buffer region 25). Thus, the active matrix substrate 1 can store in the buffer region 25 substantially all the electric charge produced in the photoconductive film 2 and then moved toward the buffer region 25 due to the diagonal electric field. Since pixels are provided in the buffer region 25, the electric charge is stored in the charge storage capacitance 13 and can be discharged and discarded similarly to the foregoing case when the image data is read out for each frame. Therefore, chances are slim for an insulation breakdown to occur in the portion due to excessively stored charge.

These effects are of course available when X-rays are shone in excessive amounts; however, even when no X-rays are being shone, these effects can effectively restrain increases in potential due to the electric charge accumulated by a dark current flow through the photoconductive film 2. Thus, the effects can effectively restrain variations in the potential of the source line 24 especially when a signal is being read and thereby restrain noise in the signal.

As detailed above, the pixel electrodes 10 in the buffer region 25 act as shield electrodes for shielding the underlying insulating layer and wiring layer from electric charge. So, those pixel electrodes 10 in the buffer region 25 may be designated differently as shield electrodes, whereas the other pixel electrodes 10, found in the image detecting region 19, are used chiefly for the image detecting.

Now, reference is made in the following description to a region outside the pixel region 18, i.e., a region in which no pixel electrodes 10 are disposed. In this region, since no common electrode 3 exists, little voltage is applied from the common electrode 3 to the photoconductive film 2 for structural reasons. Further, since the region is vastly separated from the common electrode 3 by the buffer region 25, the region is little affected by the electric field developing diagonally at the edges of the common electrode 3.

Therefore, in the region, although wires including the gate lines 20, the source lines 24, the Cs lines, etc. are provided under the first and second insulating protection layers 8 and 9, little electric charge is stored on the second insulating protection layer 9, because the electric field developing from the common electrode 3 has little effect in the region as mentioned earlier. Therefore, chances are slim for an insulation breakdown to occur due the application of a high voltage that is caused by the excessive storage of electric charge.

Note that although the buffer region 25 is specified to be five pixel wide so far, the only requirement is that the common electrode 3 should be provided in the pixel region 18. Also, it is preferable if the common electrode 3 is provided in the region surrounded by the outermost pixel electrodes 10 in the pixel region 18. In this event, those pixel electrodes 10 in the buffer region 25 do not oppose the common electrode 3 and therefore can store less electric charge than those pixel electrodes 10 opposing the common electrode 3. Consequently, the storage of electric charge due to the diagonal electric field can be more effectively restrained.

Figure 3:
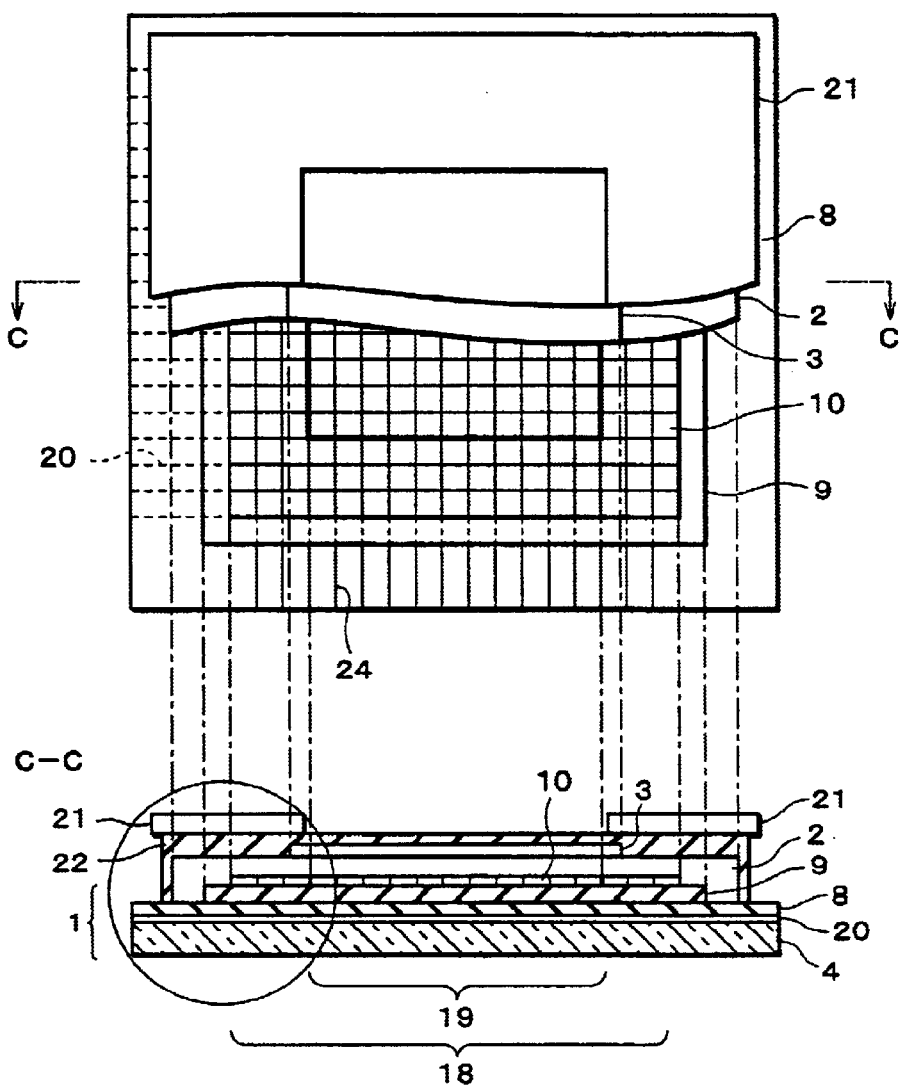
FIG. 3(a) and FIG. 3(b) show a basic arrangement of a two-dimensional image sensor of an embodiment in accordance with the present invention, FIG. 3(a) being a plan view and a cross-sectional view taken along line C—C of the plan view, FIG. 3(b) being an enlarged view of the enclosed part of the cross-sectional view of FIG. 3(a).
Figure 3:
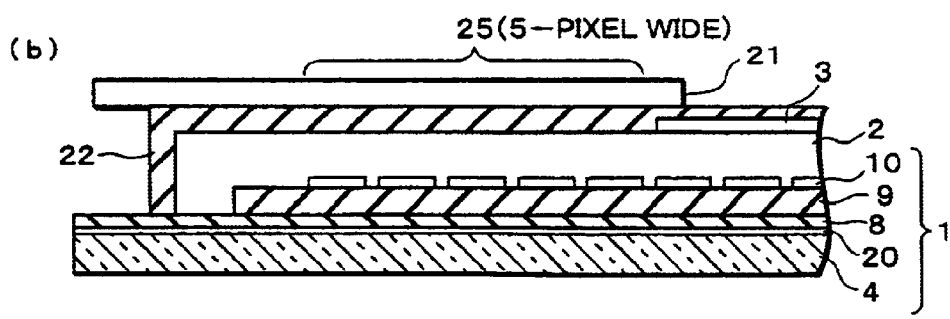
Figure 4:
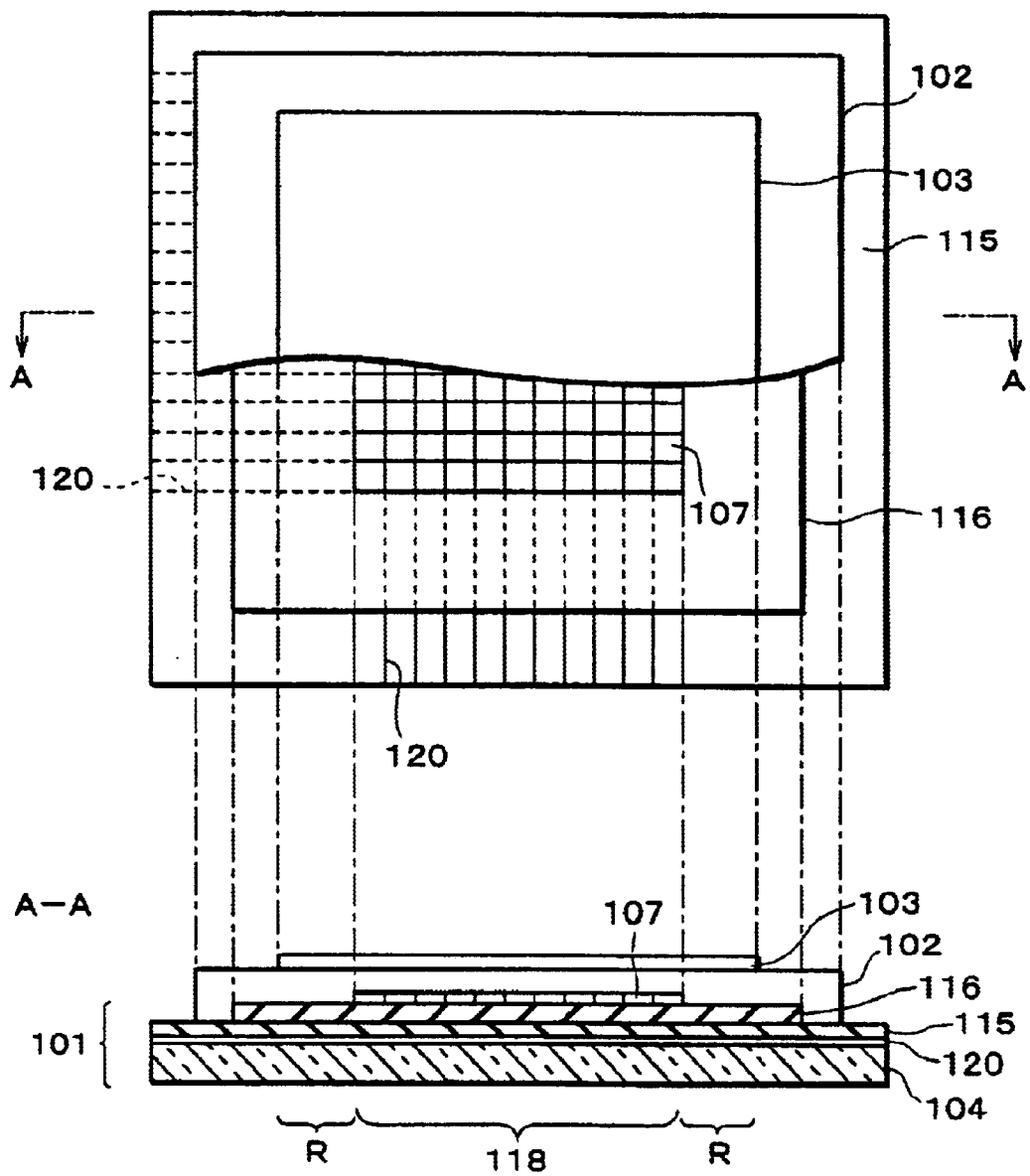
FIG. 4 is a plan view and a cross-sectional view taken along line A—A of the plan view of a conventional two-dimensional image sensor.
Figure 5:
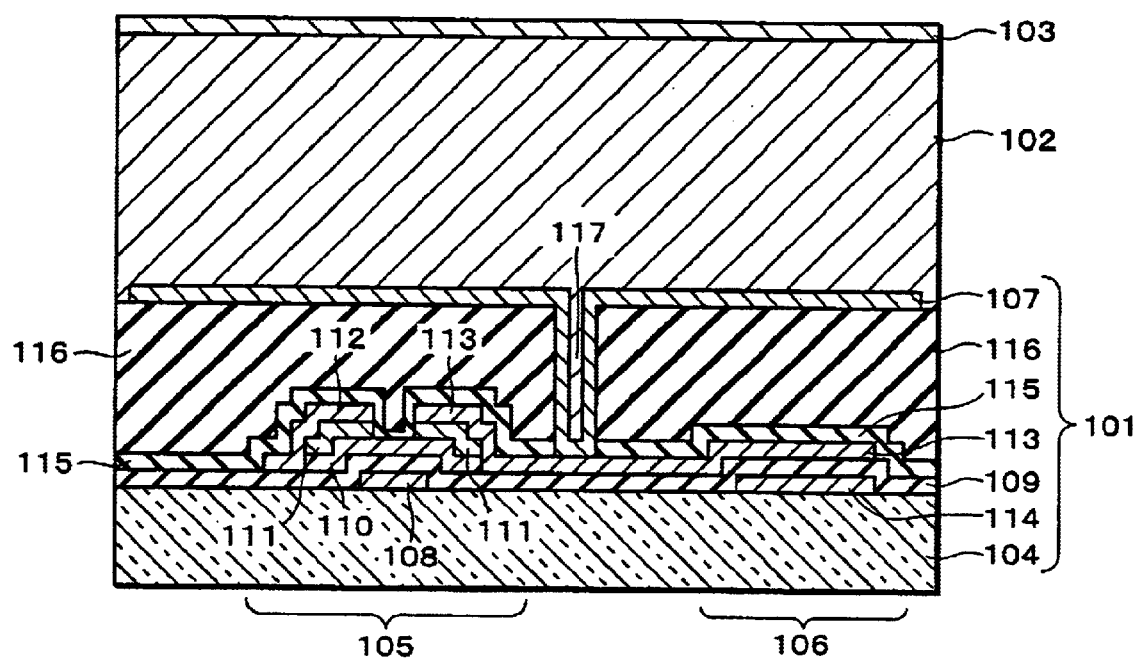
FIG. 5 is a cross-sectional view showing a single pixel in the two-dimensional image sensor of FIG. 4.

The following description will discuss a modified example of the present embodiment in reference to FIG. 3(*a*) and FIG. 3(*b*). FIG. 3(*a*) and FIG. 3(*b*) show a basic arrangement of a two-dimensional image sensor of the present modified example, FIG. 3(*a*) being a plan view and a cross-sectional view taken along line C—C of the plan view, FIG. 3(*b*) being an enlarged view of the enclosed part of the cross-sectional view of FIG. 3(*a*). FIG. 3(*a*) and FIG. 3(*b*) are equivalent to FIG. 1(*a*) and FIG. 1(*b*) respectively showing the foregoing two-dimensional image sensor. Therefore, members shown in FIG. 3(*a*) and FIG. 3(*b*) that have the same arrangement and function as those shown in FIG. 1(*a*) and FIG. 1(*b*) and that are discussed in reference to FIG. 1(*a*) and FIG. 1(*b*) are indicated by the same reference numerals and description thereof is omitted.

A two-dimensional image sensor of the present modified example has an identical configuration to that of the foregoing two-dimensional image sensor, except that the former additionally includes an X-ray shield member (shield member) 21 and an insulating film 22.

The insulating film 22 is made of silicon resin and another material so as to cover the photoconductive film 2 and the common electrode 3. The X-ray shield member 21, made of Pb (lead) and the like, is provided on a portion of the insulating film 22 that does not overlap the common electrode 3 so as to cover another portion of the insulating film 22 that overlap the photoconductive film 2. In other words, the X-ray shield member 21 is insulated by the insulating film 22 from the photoconductive film 2 and the common electrode 3.

In this structure, the X-ray shield member 21 covers a portion of the photoconductive film 2 that is not covered with the common electrode 3; thereby, the production of electric charge by the photoconductive film 2 is restrained in this portion. Thus, in the present two-dimensional image sensor, in the region outside the pixel region 18, little voltage is applied from the common electrode 3, and the amount of electric charge is produced by X-ray projection can be reduced. For these reasons, as well as for the effects of the buffer region 25, it is better ensured that no insulation breakdown occurs due to excessive storage of electric charge on the second insulating protection layer 9 on the active matrix substrate 1.

The X-ray shield member 21 can produce the above effects outside the pixel region 18 if it is disposed external to the pixel region 18 so as to overlap at least a portion of the photoconductive film 2 and located on a side of the photoconductive film 2 where X-rays enter. It is preferable, especially, if the X-ray shield member 21 is disposed external to pixel region 18 to overlap the entirety of the photoconductive film 2.

The X-ray shield member 21 may be made of a material containing Ta, W, or Ba, instead of Pb. The X-ray shield member 21, when made of one of these materials, can improve shielding effects from radiation (e.g., X-rays).

Now, the following will describe features of the present two-dimensional image sensor in reference to FIG. 1(*a*) to FIG. 3(*b*).

The present two-dimensional image sensor includes an active matrix substrate 1 including:
 electrode wires (gate lines 20, source lines 24, and Cs lines) arranged on a support substrate (glass substrate 4) in a lattice form;
 switching elements (TFTs 12) provided at respective points in the lattice;
 a charge storage capacitance 13 connected to the electrode wires via the switching elements; and
 a pixel accommodating layer constituted by pixel electrodes 10 provided at respective points in the lattice and connected to the charge storage capacitances 13.

Further, the present two-dimensional image sensor includes a photoconductive semiconductor layer (photoconductive film 2) provided on top of the pixel accommodating layer and an electrode layer (common electrode 3) provided on top of the semiconductor layer. The electrode layer is provided in a region (pixel region 18) in which the pixel accommodating layer are disposed, so as to overlap the pixel accommodating layer.

The arrangement causes little voltage to be applied to the semiconductor layer provided over a region in which no pixel electrodes 10 is provided. Therefore, the amount of the electric charge stored on the insulating layer provided over the electrode wires decreases, which prevents an insulation breakdown from occurring due to excessive storage of electric charge.

It is preferable if the electrode layer is provided in a region surrounded by at least a line of pixels in the pixel accommodating layer.

It is preferable if an image detecting region 19 in which image information is detected is further specified in a portion of the pixel accommodating layer overlapping the electrode layer.

It is preferable if a radiation shield member (radiation shield mask, X-ray shield member 21) is further provided at least over a portion of the semiconductor layer not overlapping the pixel accommodating layer. It is also preferable if the radiation shield member contains at least one of Pb, Ta, W, and Ba.

In the present embodiment, the description has been focused on two-dimensional X-ray image sensors for detecting X-rays carrying image information. Alternatively, electromagnetic radiation of other wavelengths, such as visible and infrared light, may be used to obtain the image information. The photoconductive film 2 needs to be is made from a suitably selected material that is capable of producing electric charge when irradiated with the electromagnetic radiation to be detected.

As detailed so far, the two-dimensional image sensor in accordance with the present invention includes:
 a conversion layer for converting electromagnetic radiation carrying image information to electric charge;

a pixel substrate including: a pixel accommodating layer for accommodating pixel electrodes connected to the conversion layer to accumulate the electric charge in the conversion layer; a wiring layer, located opposite the conversion layer across the pixel accommodating layer, for providing electrode wires to detect the accumulated electric charge; and an insulating layer interposed between the pixel accommodating layer and the wiring layer; and an upper electrode, located opposite the pixel accommodating layer across the conversion layer, for developing an electric field between itself and the pixel electrodes, wherein:

the upper electrode is provided in a pixel region in which the pixel electrodes are disposed.

The two-dimensional image sensor in accordance with the present invention preferably includes all the features of the foregoing two-dimensional image sensor and is such that the upper electrode is provided in a region surrounded by outermost pixel electrodes in the pixel region.

According to the arrangement, the upper electrode is provided in the pixel region, surrounded by at least a line of pixels. In other words, in the pixel region, some of the pixel electrodes are provided beneath the overlapping upper electrode, while the others are not; the latter group of pixel electrodes are located surrounding the former group of pixel electrodes.

Even when no part of the upper electrode opposes the electrode wires provided under the insulating layer, an electric field may develop diagonally from the edges of the upper electrode to the electrode wires. Due to effects of the electric field, may electric charge be stored on a portion of the insulating layer which is located, although not directly opposing the upper electrode, near a portion directly opposing the overlapping upper electrode.

The arrangement addresses this problem by designating one or more pixel electrodes along the edges of the pixel region as a "buffer" region. This buffer region restrains electric charge from being stored on the insulating layer due to effects of the diagonal electric field.

Those pixel electrodes in the buffer region do not oppose the upper electrode and therefore store less electric charge than those opposing the upper electrode. Therefore, the pixel electrodes in the buffer region readily store electric charge and more effectively restrain electric charge to be stored on the insulating layer due to effects of the diagonal electric field.

Further, the buffer region, being constituted by pixel electrodes, can regularly discharge and discard stored electric charge when electric charge is read to detect an image. This can more effectively restrain electric charge from being stored on the insulating layer due to effects of the diagonal electric field.

This prevention of electric charge from being stored on the insulating layer better prevents an insulation breakdown. Further, the storage of electric charge outside the pixel region, and hence a resultant insulation breakdown, can be restrained.

The two-dimensional image sensor in accordance with the present invention preferably includes all the features of the foregoing two-dimensional image sensor and is such that the electromagnetic radiation carrying the image information is detected in a portion of the pixel region located opposite the upper electrode across the conversion layer.

According to the arrangement, a portion of the pixel region located opposite the upper electrode is designated as a region in which the image information is detected, i.e., an image detecting region.

According to the arrangement, those pixel electrodes located opposite the upper electrode are used to detect the image information, while the remaining pixel electrodes become available for a special purpose of preventing an insulation breakdown detailed above. This prevents the quality of an image to be detected from deteriorating.

The two-dimensional image sensor in accordance with the present invention preferably includes all the features of the foregoing two-dimensional image sensor and is such that it further includes a shield member, located outside the pixel region on a side of the conversion layer where the electromagnetic radiation carrying the image information enters so as to overlap at least a portion of the conversion layer, for providing shield from the electromagnetic radiation.

According to the arrangement, a shield member for providing shield from electromagnetic radiation is provided to overlap a portion of the conversion layer over which no upper electrode is provided.

According to the arrangement, electric charge can be restrained from being produced in a portion of the conversion layer outside the pixel region due to irradiation with electromagnetic radiation. In other words, according to the arrangement, outside the pixel region, the production of electric charge, as well as the aforementioned negative effects of the electric field, can be restrained. This can further restrain electric charge to be stored on the insulating layer outside the pixel region and better ensures that no insulation breakdown occurs due to excessive storage of electric charge.

The two-dimensional image sensor in accordance with the present invention preferably includes all the features of the two-dimensional image sensor with the shield member and is such that: the electromagnetic radiation carrying the image information is X-rays; and the shield member contains at least one substance selected from the group consisting of Pb, Ta, W, and Ba.

According to the arrangement, the shield member provides better shield from radiation. Therefore, it is better ensured that no insulation breakdown occurs.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A two-dimensional image sensor, comprising:
a pixel substrate comprising: a wiring layer for providing electrode wires to detect an electric charge in pixel electrodes; an insulating layer disposed on the wiring layer; and a pixel accommodating layer for accommodating the pixel electrodes;
a conversion layer disposed on the pixel accommodating layer of the pixel substrate for converting electromagnetic radiation carrying image information to an electric charge; and
an upper electrode provided on the conversion layer for developing an electric field between the upper electrode and the pixel electrodes, wherein the upper electrode is confined in a pixel region in which the pixel electrodes are disposed.

2. The two-dimensional image sensor as defined in claim 1,
wherein:
the upper electrode is provided in a region surrounded by outermost pixel electrodes in the pixel region.

3. The two-dimensional image sensor as defined in claim 1, wherein:

the image information is detected in a portion of the pixel region where the pixel region overlaps the upper electrode.

4. The two-dimensional image sensor as defined in claim 1, wherein:
the pixel accommodating layer comprises:
an image detecting region, located where the pixel region overlaps the upper electrode; and
a buffer region disposed outside the image detecting region, the buffer region not overlapping the upper electrode.

5. The two-dimensional image sensor as defined in claim 1, further comprising:
a shield member, located outside the pixel region on a side of the conversion layer where the electromagnetic radiation carrying the image information enters so as to overlap at least a portion of the conversion layer, for providing shield from the electromagnetic radiation.

6. The two-dimensional image sensor as defined in claim 5,
wherein:
the electromagnetic radiation carrying the image information is X-rays; and
the shield member contains at least one substance selected from the group consisting of Pb, Ta, W, and Ba.

7. A two-dimensional image sensor, comprising:
an active matrix substrate including pixel electrodes arranged in a matrix form;
a conversion layer, provided to cover the pixel electrodes and to be electrically connected to the pixel electrodes on the active matrix substrate, for converting incident electromagnetic radiation carrying image information to electric charge; and
an upper electrode, provided on the conversion layer for developing an electric field between the upper electrode and the pixel electrodes, wherein:
a pixel region in which the pixel electrodes are disposed includes a portion of the active matrix substrate which overlaps the upper electrode and is larger than a region overlapping the upper electrode.

8. The two-dimensional image sensor as defined in claim 7, wherein:
the pixel region includes:
an image detecting region, where the pixel region overlaps the upper electrode, for accommodating pixel electrodes for detecting the converted electric charge carrying the image information; and
a buffer region, provided outside the image detecting region, for accommodating pixel electrodes which do not overlap the upper electrode.

9. The two-dimensional image sensor as defined in claim 8,
wherein:
the buffer region encloses the image detecting region.

10. The two-dimensional image sensor as defined in claim 8,
wherein:
pixel electrodes disposed in the buffer region can discharge electric charge transmitted from the conversion layer.

11. A two-dimensional image sensor, comprising:
a pixel substrate comprising: a wiring layer for providing electrode wires to detect an electric charge in pixel electrodes; an insulating layer disposed on the wiring layer; and a pixel accommodating layer for accommodating the pixel electrodes;
a conversion layer disposed on the pixel accommodating layer of the pixel substrate for converting electromagnetic radiation carrying image information to an electric charge; and
an upper electrode provided on the conversion layer for developing an electric field between the upper electrode and the pixel electrodes,
wherein the upper electrode is provided in a region surrounded by outermost pixel electrodes in a pixel region in which the pixel electrodes are disposed.

12. A two-dimensional image sensor, comprising:
a pixel substrate comprising: a wiring layer for providing electrode wires to detect an electric charge in pixel electrodes; an insulating layer disposed on the wiring layer; and a pixel accommodating layer for accommodating the pixel electrodes;
a conversion layer disposed on the pixel accommodating layer of the pixel substrate for converting electromagnetic radiation carrying image information to an electric charge; and
an upper electrode provided on the conversion layer for developing an electric field between the upper electrode and the pixel electrodes,
wherein the upper electrode is provided in a pixel region in which the pixel electrodes are disposed; and
the pixel accommodating layer comprises an image detecting region where the pixel region overlaps the upper electrode, and a buffer region disposed outside the image detecting region, the buffer region not overlapping the upper electrode.

13. A two-dimensional image sensor, comprising:
a pixel substrate comprising: a wiring layer for providing electrode wires to detect an electric charge in pixel electrodes; an insulating layer disposed on the wiring layer; and a pixel accommodating layer for accommodating the pixel electrodes;
a conversion layer, disposed on the pixel accommodating layer on the pixel substrate, for converting electromagnetic radiation carrying image information to electric charge; and
an upper electrode, provided on the conversion layer, for developing an electric field between the upper electrode and the pixel electrodes,
wherein the upper electrode is provided in a pixel region in which the pixel electrodes are disposed; and
the two-dimensional image sensor further comprises a shield member, located outside the pixel region on a side of the conversion layer which the electromagnetic radiation carrying the image information enters, and overlaps at least a portion of a region in which the conversion layer is provided, for providing a shield from the electromagnetic radiation.

14. The two-dimensional image sensor as defined in claim 13, wherein:
the electromagnetic radiation carrying the image information is X-rays; and
the shield member contains at least one substance selected from the group consisting of Pb, Ta, W, and Ba.

* * * * *